(12) United States Patent
Cho et al.

(10) Patent No.: US 10,035,708 B2
(45) Date of Patent: Jul. 31, 2018

(54) METHOD FOR MANUFACTURING GRAPHENE USING COVER MEMBER AND METHOD FOR MANUFACTURING ELECTRONIC ELEMENT INCLUDING SAME

(71) Applicant: CENTER FOR ADVANCED SOFT ELECTRONICS, Pohang-si, Gyeongsangbuk-do (KR)

(72) Inventors: Kilwon Cho, Pohang-si (KR); Hyojin Bong, Seoul (KR)

(73) Assignee: CENTER FOR ADVANCED SOFT ELECTRONICS, Pohang-si (KR)

( * ) Notice: Subject to any disclaimer, the term of this patent is extended or adjusted under 35 U.S.C. 154(b) by 163 days.

(21) Appl. No.: 14/899,985

(22) PCT Filed: Jun. 26, 2014

(86) PCT No.: PCT/KR2014/005677
§ 371 (c)(1),
(2) Date: Dec. 18, 2015

(87) PCT Pub. No.: WO2014/209030
PCT Pub. Date: Dec. 31, 2014

(65) Prior Publication Data
US 2016/0137509 A1    May 19, 2016

(30) Foreign Application Priority Data
Jun. 27, 2013    (KR) .................. 10-2013-0074246

(51) Int. Cl.
*C23C 16/06*    (2006.01)
*C23C 16/26*    (2006.01)
(Continued)

(52) U.S. Cl.
CPC ........ *C01B 31/0453* (2013.01); *C01B 32/186* (2017.08); *C23C 16/0272* (2013.01);
(Continued)

(58) Field of Classification Search
CPC .......... C23C 16/06; C23C 16/26; C23C 16/40
See application file for complete search history.

(56) References Cited

U.S. PATENT DOCUMENTS

| 9,142,635 B2 | 9/2015 | Heo et al. |
| 2012/0037919 A1* | 2/2012 | Xu ........................ B82Y 15/00 257/76 |

(Continued)

FOREIGN PATENT DOCUMENTS

| CN | 101423209 A | 5/2009 |
| CN | 102738237 A | 10/2012 |

(Continued)

OTHER PUBLICATIONS

Soler, Victor-Manuel Freire, et al., "Hot-Wire Chemical Vapor Deposition of Few-Layer Graphene on Copper Substrates". Japanese Journal of Applied Physics 52 (2013) 01AK02, pp. 1-6.*

(Continued)

*Primary Examiner* — Bret P Chen
(74) *Attorney, Agent, or Firm* — STIP Law Group, LLC

(57) ABSTRACT

A method of manufacturing graphene, including forming a metal catalytic layer on a substrate (Step a), providing a cover member on the metal catalytic layer of Step a (Step b), and growing graphene on the metal catalytic layer of Step b by performing chemical vapor deposition (Step c), whereby the size of the micro-scale grain boundary on the surface of the metal catalyst can be reduced by simultaneously promoting the aggregation of metal catalytic molecules in a chemical vapor deposition device and preventing the evaporation of the metal catalyst due to the effect of the cover (Continued)

member, ultimately improving the quality of synthesized graphene, including the transparency thereof. Also, a graphene sheet can be grown under various concentrations of carbon source gas, and efficient mass production thereof is possible in a chemical vapor deposition device having a confined space.

14 Claims, 11 Drawing Sheets

(51) Int. Cl.
<br>      *C01B 31/04*         (2006.01)
<br>      *C23C 16/02*         (2006.01)
<br>      *C01B 32/186*       (2017.01)

(52) U.S. Cl.
<br>     CPC .......... *C23C 16/26* (2013.01); *C01B 2204/32* (2013.01); *Y02P 20/149* (2015.11)

(56) References Cited

U.S. PATENT DOCUMENTS

| | | | |
|---|---|---|---|
| 2012/0068160 A1* | 3/2012 | Yamazaki | B82Y 10/00 257/29 |
| 2012/0225296 A1* | 9/2012 | Zhong | B82Y 30/00 428/408 |
| 2012/0241069 A1* | 9/2012 | Hofmann | B82Y 30/00 156/60 |
| 2013/0001515 A1* | 1/2013 | Li | H01L 21/0242 257/24 |
| 2013/0273260 A1* | 10/2013 | Chueh | C01B 31/0446 427/555 |

FOREIGN PATENT DOCUMENTS

| | | |
|---|---|---|
| EP | 2055673 A1 | 5/2009 |
| KR | 10-2011-0006644 A | 1/2011 |
| KR | 10-2011-0083546 A | 1/2011 |
| KR | 10-2012-0088524 A | 8/2012 |
| KR | 10-2013-0014182 A | 2/2013 |

OTHER PUBLICATIONS

Lee, Jeong-Hoon, et al. "Graphene Growth at the Interface Between Ni Catalyst Layer and SiO2/Si Substrate". Journal of Nanoscience and Nanotechnology vol. 11, 6468-6471, 2011.*

He, Fei, et al., "Synthesis of three-dimensional reduced graphene oxide layer supported cobalt nanocrystals and their high catalytic activity in F-T Co2 hydrogenation". Nanoscale, 2013, 5, 8507-8516.*

Rybin, Maxim G., et al., "Control of number of graphene layers grown by chemical vapor deposition". Phys. Status Solidi C 7, No. 11-12, 2785-2788 (2010).*

* cited by examiner

Conventional chemical vapor deposition

Chemical vapor deposition using cover member

Ex.1

C.Ex.1

C.Ex.7

Ex.1

C.Ex.1

C.Ex.7

METHOD FOR MANUFACTURING GRAPHENE USING COVER MEMBER AND METHOD FOR MANUFACTURING ELECTRONIC ELEMENT INCLUDING SAME

This is a U.S. national stage application of PCT Application No. PCT/KR2014/005677 under 35 U.S.C. 371, filed Jun. 26, 2014 in Korean, claiming the priority benefit of Korean Application No. 10-2013-0074246, filed Jun. 27, 2013, which is hereby incorporated by reference.

TECHNICAL FIELD

The present invention relates to a method of manufacturing graphene and a method of manufacturing an electronic device including graphene and, more particularly, to a method of forming graphene through chemical vapor deposition using a cover member, and a method of manufacturing an electronic device including graphene formed thereby.

BACKGROUND ART

Graphene is a monolayer thin-film having a planar honeycomb structure, achieved through chemical bonding of carbon atoms with a sp2 hybrid orbital. Since graphene has very high conductivity and is flexible, it is receiving attention as an alternative to inorganic material such as silicon, which is fragile and easily breakable.

Methods of synthesizing graphene include mechanical or chemical peeling, chemical vapor deposition, epitaxial synthesis, organic synthesis and the like. In particular, chemical vapor deposition is very suitable for the mass production of large, high-quality graphene layers.

In its current state, chemical vapor deposition is problematic because the metal catalyst for growing graphene is directly exposed to flowing gas and the extent of growth of graphene may vary depending on the concentration of material gas. In the case where the concentration of material gas is too low, it is difficult to synthesize graphene.

Furthermore, chemical vapor deposition causes graphene to grow at a high temperature. In this case, as the grains of the metal catalyst grow, the grains may come into contact with each other at the grain boundary. It is easy to form multilayer graphene at the grain boundary of the metal catalyst, and the multilayer graphene may deteriorate the light transmittance of the final graphene sheet. Specifically, because the grain size of the metal catalyst is small and many grain boundaries are formed, the area in which synthesized graphene takes a multilayer form is likely to increase, consequently decreasing the light transmittance of graphene. The preparation of graphene using conventional chemical vapor deposition suffers from low transmittance of synthesized graphene attributable to the metal catalyst having a small grain size with many grain boundaries. Hence, there is a need for a graphene synthesis method in which the grain size of the metal catalyst is increased and the scale of the grain boundary is reduced, thus suppressing the growth of multilayer graphene so as to increase light transmittance.

In the conventional synthesis of graphene, graphene is synthesized under a condition such that the surface of a metal catalyst (e.g. Cu), useful for the synthesis of monolayer graphene, is exposed in a deposition machine. As such, upon chemical vapor deposition at a temperature approximately as high as the melting point of the catalyst (e.g. 1,040° C. for Cu), the surface of the catalyst is undesirably melted.

DISCLOSURE

Technical Problem

Accordingly, the present invention is intended to provide a method of manufacturing graphene using chemical vapor deposition, in which the graphene is configured such that the number of thin-film layers is uniform under a variety of gas composition conditions, thus increasing the efficiency of production of graphene having uniform quality. Furthermore, as the grain size is increased and the number of grains on the surface of the metal catalyst is decreased, the size of the grain boundary is reduced, thereby suppressing the growth of multilayer graphene, which readily forms at the grain boundary, and ultimately improving the light transmittance of graphene.

Technical Solution

An aspect of the present invention provides a method of manufacturing graphene, comprising: forming a metal catalytic layer on a substrate (Step a); providing a cover member on the metal catalytic layer of Step a (Step b); and growing graphene on the metal catalytic layer of Step b by performing chemical vapor deposition (Step c).

The cover member may be a substrate including at least one selected from the group consisting of an inorganic material, a metal, and an oxide thereof.

The inorganic material may include at least one selected from the group consisting of silicon, ceramic, and quartz.

The metal may include at least one selected from the group consisting of aluminum, tin, copper, iron, nickel, cobalt, and stainless steel.

The substrate may include at least one selected from the group consisting of an inorganic material, a metal, and an oxide thereof.

The metal catalytic layer may include at least one selected from the group consisting of nickel, iron, copper, platinum, palladium, ruthenium, and cobalt.

The chemical vapor deposition may be performed using a mixture comprising hydrogen, argon, methane and ethane.

The method may further comprise removing the cover member from the product of Step c and forming a polymer support layer on graphene (Step d), after Step c.

The method may further comprise removing the substrate and the metal catalytic layer from the product of Step d to obtain graphene having the polymer support layer formed thereon (Step f), after Step d.

The method may further comprise removing the substrate, the metal catalytic layer and the cover member from the product of Step c to obtain graphene (Step e), after Step c.

The forming the metal catalytic layer may be performed using any one process selected from the group consisting of sputtering, thermal evaporation, and e-beam evaporation.

The metal catalytic layer may be formed to a thickness of 10 to 1,000 nm on the substrate.

The chemical vapor deposition may be performed at a temperature of 400 to 1,300° C.

The chemical vapor deposition may be performed using any one process selected from the group consisting of low-pressure chemical vapor deposition, atmospheric pressure chemical vapor deposition, plasma-enhanced chemical vapor deposition, Joule-heating chemical vapor deposition, and microwave chemical vapor deposition.

Another aspect of the present invention provides a method of manufacturing an electronic device, comprising: forming a metal catalytic layer on a substrate (Step 1); providing a cover member on the metal catalytic layer of Step 1 (Step 2); growing graphene on the metal catalytic layer of Step 2 by performing chemical vapor deposition (Step 3); removing the substrate, the metal catalytic layer and the cover member from the product of Step 3, thus obtaining graphene (Step 4); and manufacturing an electronic device including the graphene of Step 4 (Step 5).

The electronic device may include any one selected from the group consisting of an electrode, a touch panel, an electroluminescent display, a backlight unit, a radio frequency identification (RFID) tag, a solar cell module, an electronic paper, a thin film transistor (TFT) for a flat panel display, and a TFT array.

Advantageous Effects

Upon the production of graphene using chemical vapor deposition according to the present invention, graphene can be uniformly formed under a variety of gas composition conditions, thus increasing production efficiency and reducing production costs. Also, as the grain size is increased and the number of grains on the surface of a metal catalyst is decreased, the size of the grain boundary is reduced, thus suppressing the growth of multilayer graphene, which readily forms at the grain boundary, thereby increasing the light transmittance and flexibility of the graphene.

MODE FOR INVENTION

Figure 1:
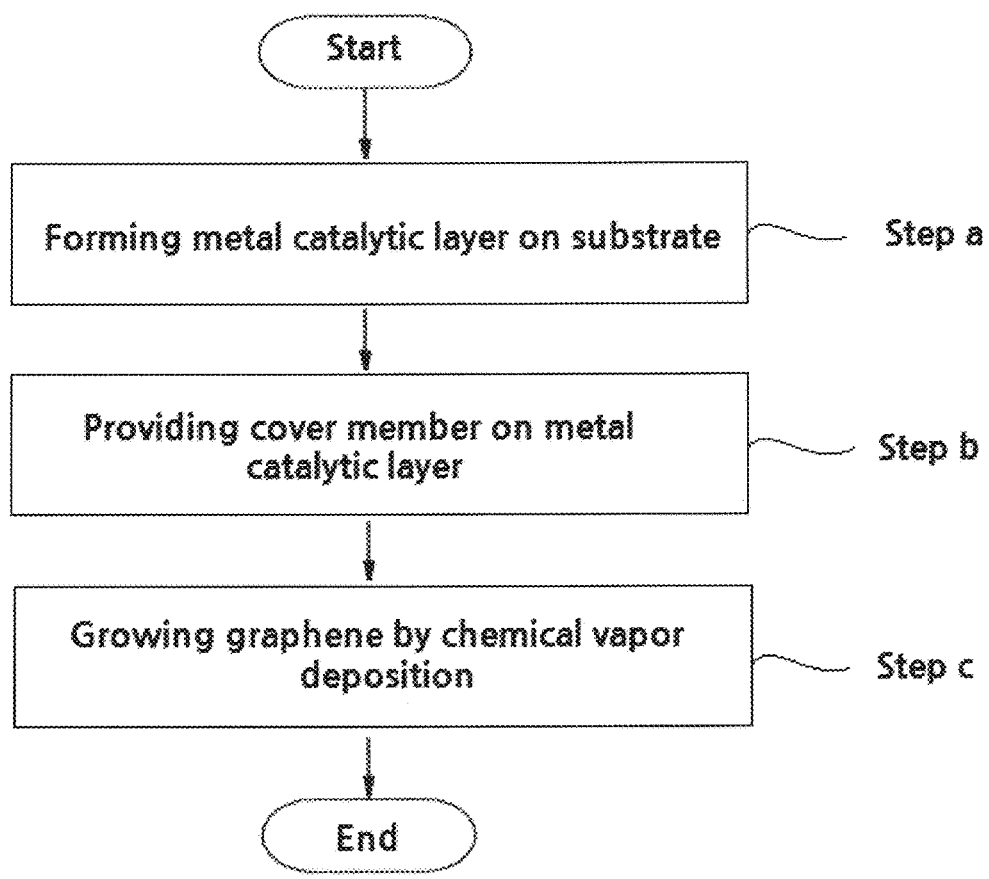
FIG. 1 is a flowchart sequentially illustrating the process of manufacturing a graphene sheet according to an aspect of the present invention.

Hereinafter, a detailed description will be given of the method of manufacturing graphene according to the present invention, with reference to FIG. 1.

Specifically, a metal catalytic layer for growing graphene is formed on a substrate (Step a).

The substrate may include an inorganic material, a metal, and an oxide thereof.

The inorganic material may include silicon, ceramic, or quartz, and the metal may include aluminum, tin, copper, iron, cobalt, or stainless steel.

The metal catalytic layer functions to grow the graphene layer, and may include nickel, copper, platinum, iron, palladium, ruthenium, or cobalt. In addition thereto, any metal may be used so long as it facilitates the growth of graphene.

The metal catalytic layer may be formed through sputtering, thermal evaporation, or e-beam evaporation.

The metal catalytic layer may be formed to a thickness of 10 to 1000 nm, preferably 100 to 600 nm, and more preferably 300 to 500 nm, on the substrate.

Subsequently, a cover member is provided on the metal catalytic layer of Step a (Step b).

The cover member is a structural body that plays a role in preventing the surface of the metal catalytic layer from being directly exposed to the outside.

The cover member may include an inorganic material, a metal, and an oxide thereof. As such, the inorganic material may include silicon, ceramic, or quartz, and the metal may include aluminum, tin, copper, iron, nickel, cobalt, or stainless steel. However, the material for the cover member is not limited to the foregoing, and any material may be used without limitation so long as it is able to withstand the temperature for subsequent chemical vapor deposition.

Thereafter, chemical vapor deposition is performed so as to grow graphene on the catalytic layer of Step b (Step c).

This chemical vapor deposition may be carried out using a gas mixture comprising hydrogen, argon, methane and ethane.

Examples of the chemical vapor deposition may include low-pressure chemical vapor deposition, atmospheric pressure chemical vapor deposition, plasma-enhanced chemical vapor deposition, Joule-heating chemical vapor deposition, and microwave chemical vapor deposition. In addition thereto, any process may be used, so long as the graphene layer is grown on the metal catalytic layer.

The chemical vapor deposition is performed at a temperature of 400 to 1300° C., and preferably 800 to 1000° C.

In some cases, removing the cover member from the product of Step c and forming a polymer support layer on graphene (Step d) may be performed, after Step c.

Also, removing the substrate, the metal catalytic layer and the cover member from the product of Step c to obtain graphene (Step e) may be carried out, without performing Step d, after Step c.

After the formation of the polymer support layer in Step d, removing the substrate and the metal catalytic layer from the product of Step d to obtain graphene having the polymer support layer formed thereon (Step f) may be implemented.

Figure 2:
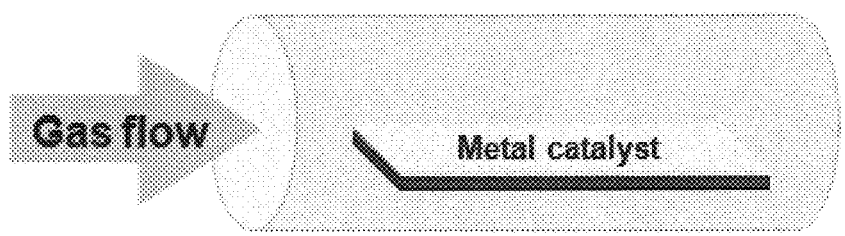
FIG. 2 schematically illustrates chemical vapor deposition using a substrate having a metal catalytic layer for growing graphene with the use of a cover member and conventional chemical vapor deposition without the use of a cover member.
Figure 2:
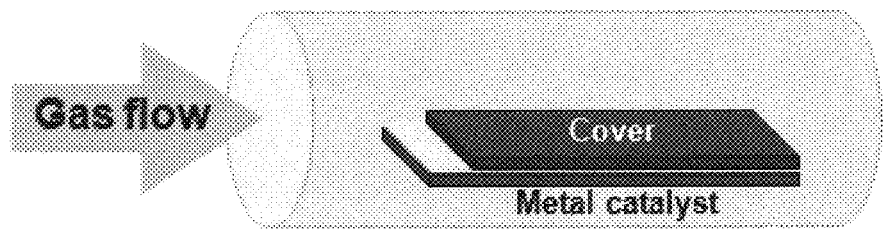

The chemical vapor deposition process in the method of producing graphene as described above and the conventional chemical vapor deposition process without the use of a cover member are compared, and are illustrated in FIG. 2.

The graphene thus formed may be applied to various electronic devices in such a manner that a graphene layer is transferred onto a substrate of interest.

Specifically, the laminate structure, comprising substrate/metal catalytic layer/graphene/polymer support layer, is formed in Steps a to d, from which the substrate and the metal catalytic layer are then removed, whereby only the graphene/polymer support layer may be left behind. Here, the polymer support may include an acrylate-based polymer material including polymethylmethacrylate (PMMA), a variety of commercially available polymer materials, and a silicone polymer.

The graphene may be transferred onto the substrate of interest using the graphene/polymer support layer. After the transfer process, the polymer support layer may be removed, and the solvent used to remove the polymer support layer may include an organic solvent, such as chloroform, toluene, or acetone, or an inorganic solvent.

As described above, the graphene sheet transferred onto the substrate of interest may be applied to a flexible electronic device, a transparent electronic device, etc., and specific examples of the electronic device may include an electrode, a touch panel, an electroluminescent display, a backlight unit, an RFID tag, a solar cell module, an electronic paper, a TFT for a flat panel display, and a TFT array.

EXAMPLES

A better understanding of the present invention may be obtained through the following examples which are set forth to illustrate, but are not to be construed to limit the scope of the present invention.

Example 1

Nickel was thermally evaporated in film form to a thickness of 400 nm on a silicon wafer substrate having a silicon oxide layer 300 nm thick. The temperature of the furnace of a chemical vapor deposition machine was elevated to 900° C., after which a movable pipe, in which the nickel-deposited substrate was placed, was rapidly placed in the furnace. A silicon wafer was positioned as a cover member on the 400 nm thick nickel-deposited substrate so as to prevent the surface of the nickel from being exposed. While the reactive gas mixture (hydrogen: 100 sccm, argon: 500 sccm, methane gas: 2 sccm) was allowed to flow, graphene was grown, after which only hydrogen gas was allowed to flow, and cooling to room temperature at a rate of 10° C./min was carried out.

Subsequently, a polymethylmethacrylate solution was applied as a graphene support layer, and the silicon oxide layer was melted with a 5 wt % hydrofluoric acid solution, and only the nickel layer was melted from the film, comprising nickel layer/graphene layer/polymer support layer, using a $FeCl_3$ solution. The graphene layer/polymer support layer floating in the solution was transferred onto a substrate of interest, and the polymer support layer was removed with chloroform, whereby the graphene alone was left behind on the substrate of interest.

Examples 2 to 6

A graphene layer was formed and transferred onto a substrate of interest in the same manner as in Example 1, with the exception that the flow rates of the reactive gas mixture were changed as shown in Table 1 below.

Comparative Example 1: Chemical Vapor Deposition when Metal Catalytic Layer was Exposed A graphene layer was formed using chemical vapor deposition and transferred onto a substrate of interest in the same manner as in Example 1, with the exception that the silicon wafer, as the cover member, was not provided on the nickel-deposited substrate.

Comparative Examples 2 to 6

A graphene layer was formed and transferred onto a substrate of interest in the same manner as in Comparative Example 1, with the exception that the flow rates of the reactive gas mixture were changed as shown in Table 1 below.

Comparative Example 7

Nickel was thermally evaporated on a silicon wafer substrate in the same manner as in Example 1, and chemical vapor deposition was not performed.

TABLE 1

| | Hydrogen (sccm) | Argon (sccm) | Methane (sccm) | Methane conc. ratio (vol %) | Cover member (Si wafer) (used: ◯, not used: X) | Graphene layer (produced: ◯, not produced: X) |
|---|---|---|---|---|---|---|
| Ex. 1 | 100 | 500 | 2 | 0.33 | ◯ | ◯ |
| Ex. 2 | 100 | 500 | 10 | 1.64 | ◯ | ◯ |
| Ex. 3 | 100 | 500 | 15 | 2.44 | ◯ | ◯ |
| Ex. 4 | 100 | 500 | 20 | 3.23 | ◯ | ◯ |
| Ex. 5 | 100 | 500 | 50 | 7.69 | ◯ | ◯ |
| Ex. 6 | 100 | 500 | 70 | 10.45 | ◯ | ◯ |
| C. Ex. 1 | 100 | 500 | 2 | 0.33 | X | X |
| C. Ex. 2 | 100 | 500 | 10 | 1.64 | X | X |
| C. Ex. 3 | 100 | 500 | 15 | 2.44 | X | ◯ |
| C. Ex. 4 | 100 | 500 | 20 | 3.23 | X | ◯ |
| C. Ex. 5 | 100 | 500 | 50 | 7.69 | X | ◯ |
| C. Ex. 6 | 100 | 500 | 70 | 10.45 | X | ◯ |
| C. Ex. 7 | — | — | — | — | — | — |

TEST EXAMPLES

The measurement methods in test examples according to the present invention are as follows.

The morphology of graphene was observed using an optical microscope (Axioplan, Zeiss), and Raman analysis was performed at 532 nm using a Raman spectrometer (WITec, Micro Raman). The transmittance of graphene was measured in a transparent mode through UV-vis analysis, and sheet resistance was measured using a four-probe resistance meter. The surface of the nickel catalyst was observed in a tapping mode using an atomic force microscope (Digital Instruments Multimode Nanoscope III), and normal-mode XRD (X-ray Diffraction) was measured at 9 C beamline (wavelength: 1.08 Å) using the Pohang Light Source.

Test Example 1: Confirmation of Formation of Graphene Layer

Figure 3:
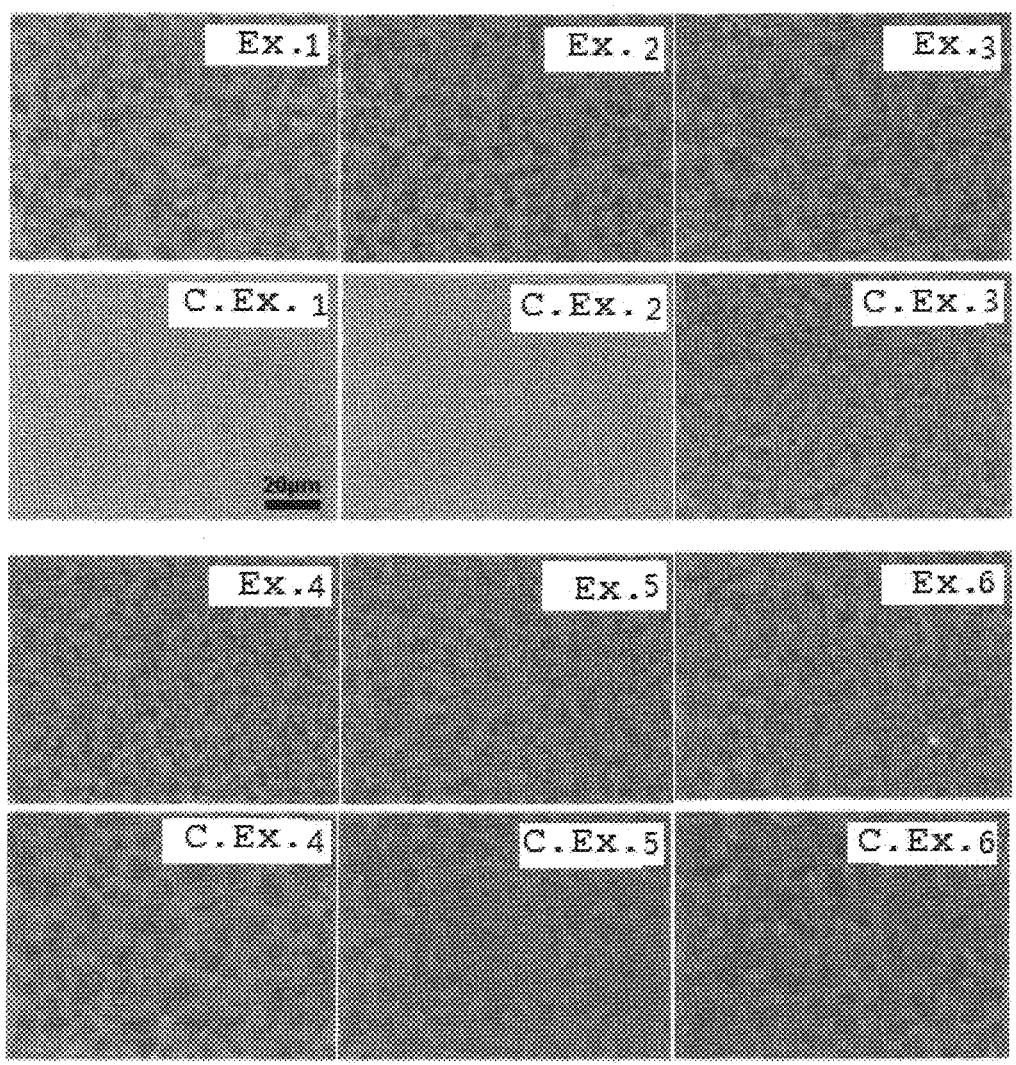
FIG. 3 illustrates optical microscope images of the graphene layers synthesized in Examples 1 to 6 and Comparative Examples 1 to 6.
Figure 4:
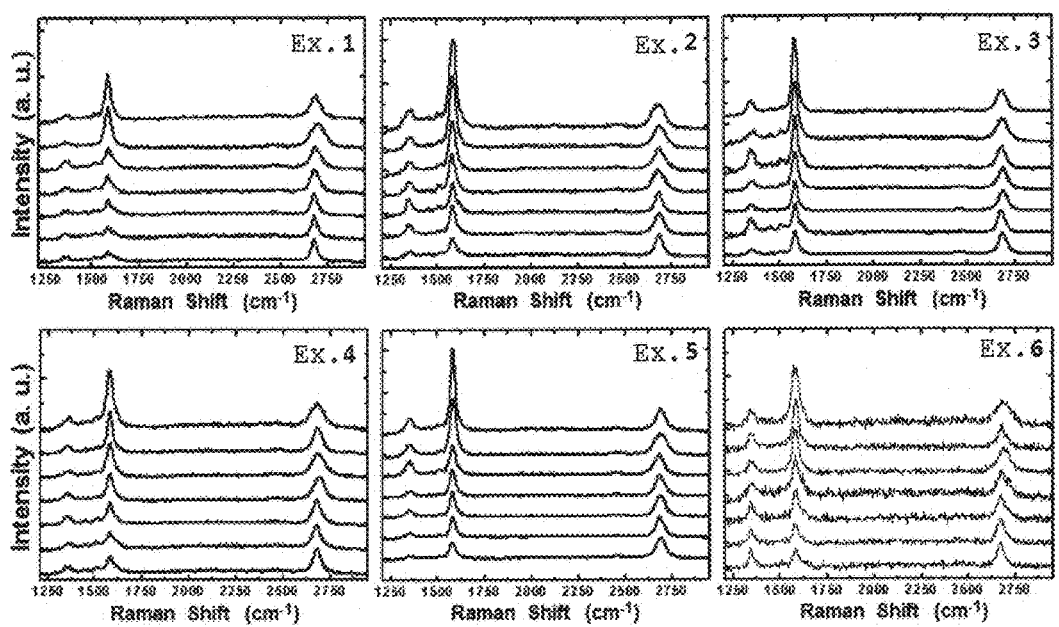
FIG. 4 illustrates the results of Raman analysis of the graphene layers formed in Examples 1 to 6.
Figure 5:
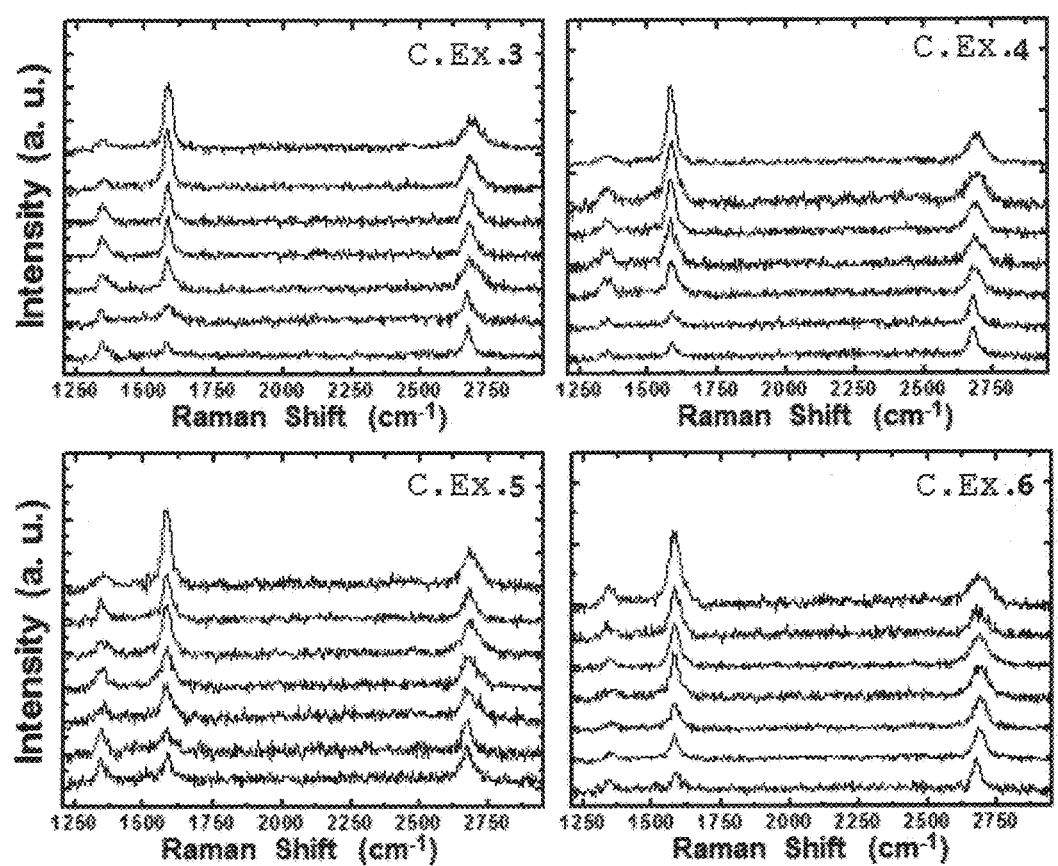
FIG. 5 illustrates the results of Raman analysis of the graphene layers formed in Comparative Examples 1 to 6.

The optical microscope images of the graphene layers synthesized in Examples 1 to 6 and Comparative Examples 1 to 6 are shown in FIG. 3, the results of Raman analysis of the graphene layers of Examples 1 to 6 are shown in FIG. 4, and the results of Raman analysis of the graphene layers of Comparative Examples 1 to 6 are shown in FIG. 5.

As shown in FIGS. 3 to 5, the graphene layers of Examples 1 to 6 were formed efficiently, with various distributions ranging from the monolayer to the multilayer. Here, the 2D peak was observed at about 2700 $cm^{-1}$, the G peak was observed at about 1580 $cm^{-1}$, and the D peak appeared at about 1360 $cm^{-1}$.

As shown in FIG. 3, in Comparative Examples 1 and 2, in which the metal catalytic layer was exposed without the use of the cover member, graphene was not produced. In the case where chemical vapor deposition was performed under the condition that the methane concentration was relatively low, it was difficult to grow graphene. However, in Examples 1 and 2 according to the present invention, graphene was formed even when the concentration of methane gas was low.

That is, when the cover member was applied on the metal catalytic layer, it was possible to stably form graphene under less influence from the concentration of reactive gas, which was varied by controlling the flow of the gas.

Figure 6:
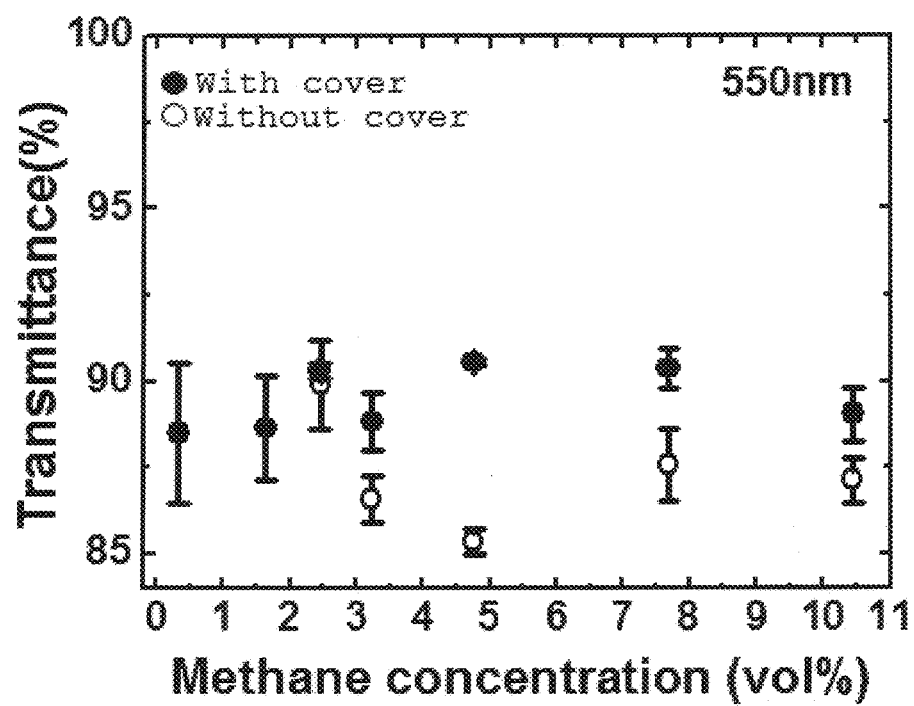
FIG. 6 illustrates the results of measurement of light transmittance at a wavelength of 550 nm of the graphene layers manufactured in Examples 1 to 6 and Comparative Examples 1 to 6.

Test Example 2: Analysis of Transmittance and Sheet Resistance of Graphene Layer The results of measurement of light transmittance at a wavelength of 550 nm of the graphene layers manufactured in Examples 1 to 6 and Comparative Examples 1 to 6 were compared and are shown in FIG. 6. The results of measurement of sheet resistance thereof are illustrated in FIG. 7.

Figure 7:
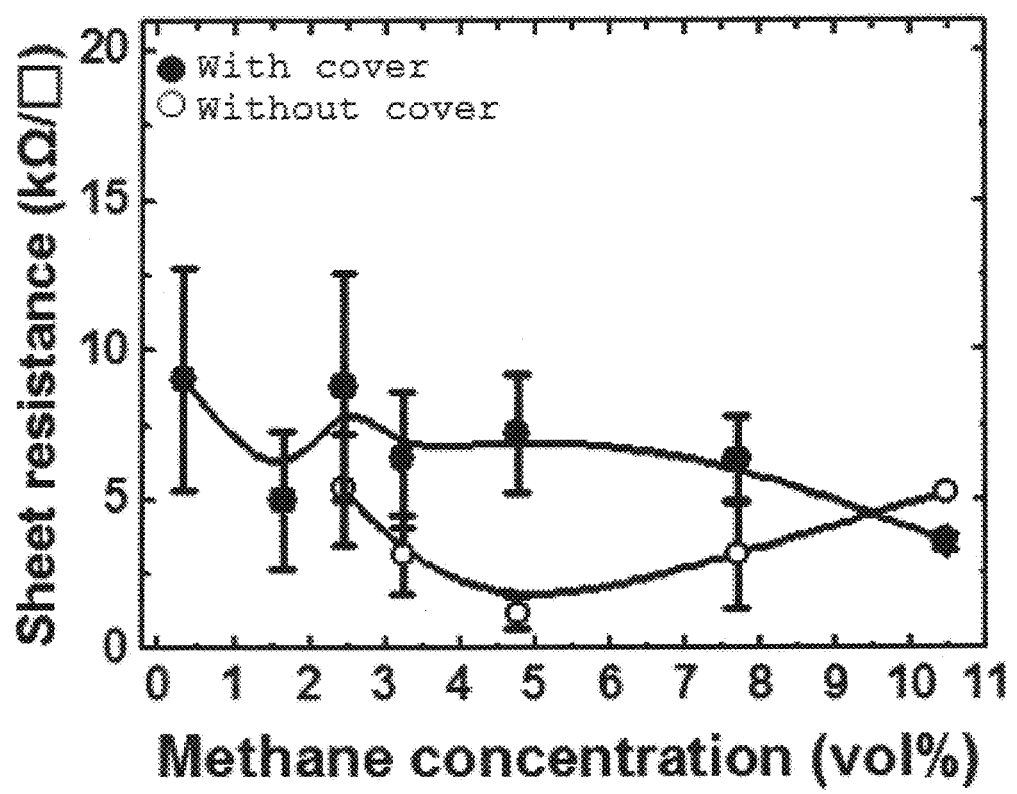
FIG. 7 illustrates the results of measurement of sheet resistance of the graphene layers manufactured in Examples 1 to 6 and Comparative Examples 1 to 6.

As shown in FIGS. 6 and 7, when the graphene layer was formed using the cover member according to the present invention, light transmittance was high and sheet resistance was increased slightly, compared to when the cover member was not used. This means that a thin graphene layer was formed due to the use of the cover member, and thus light transmittance was improved.

Test Example 3: Comparison of Grain Size of Metal Catalyst and Grain Boundary

Figure 8:
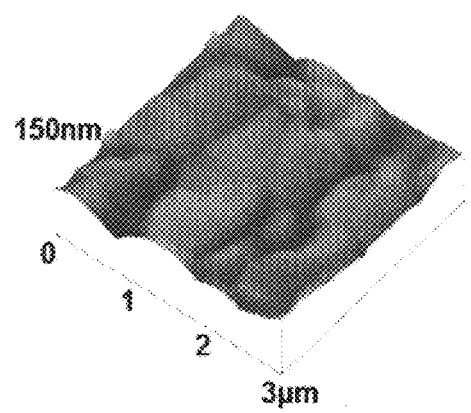
FIG. 8 illustrates atomic force microscope images of the surfaces of nickel catalytic layers in Example 1 and Comparative Examples 1 and 7.
Figure 8:
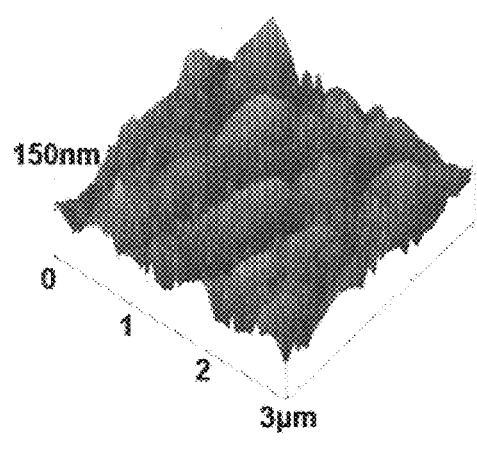
Figure 8:
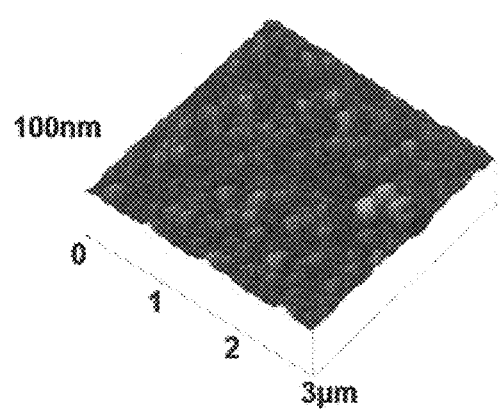
Figure 9:
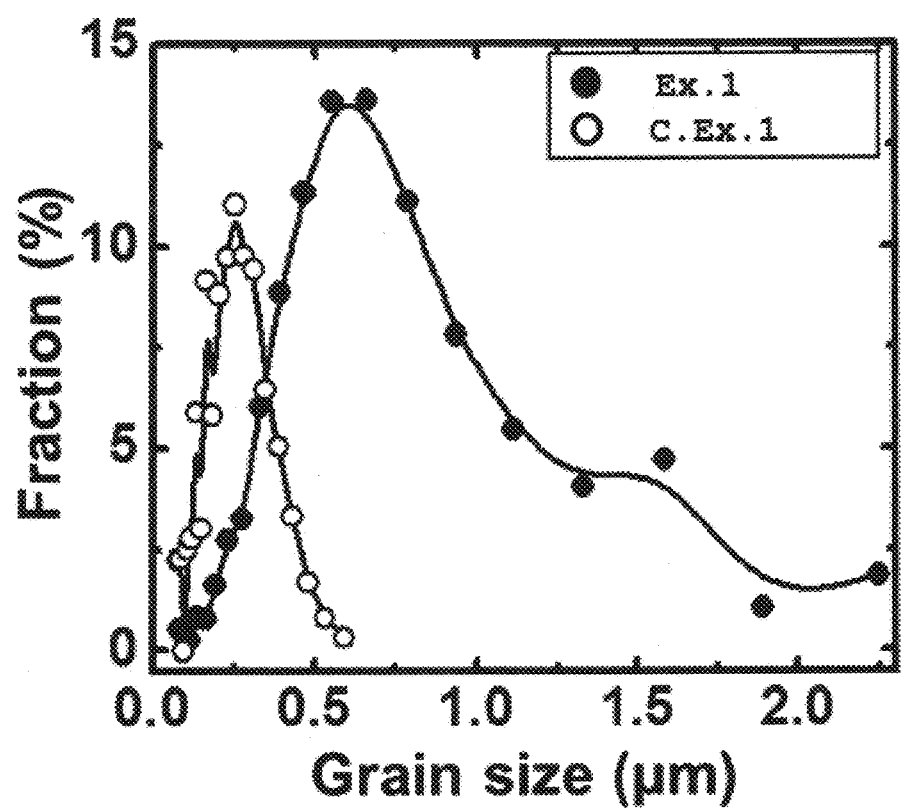
FIG. 9 is a graph illustrating the results of analysis of grain size of the nickel catalysts using EBSD (Electron Back Scattering Diffraction)
Figure 10:
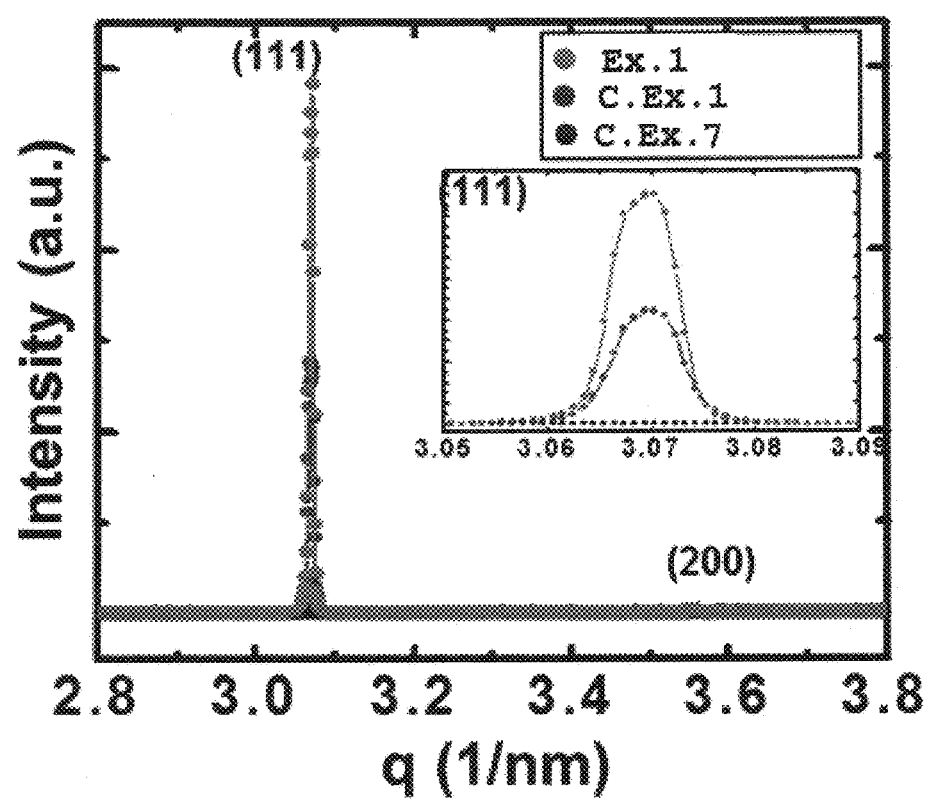
FIG. 10 is a graph illustrating the results of analysis of the nickel catalytic layers based on XRD (X-ray Diffraction)
Figure 11:
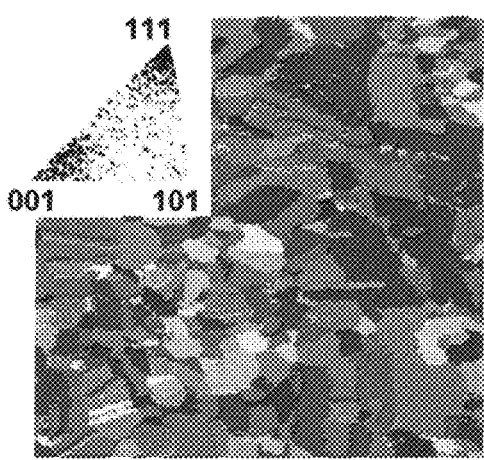
FIG. 11 illustrates the crystal orientation of the surfaces of the nickel catalytic layers using EBSD.
Figure 11:
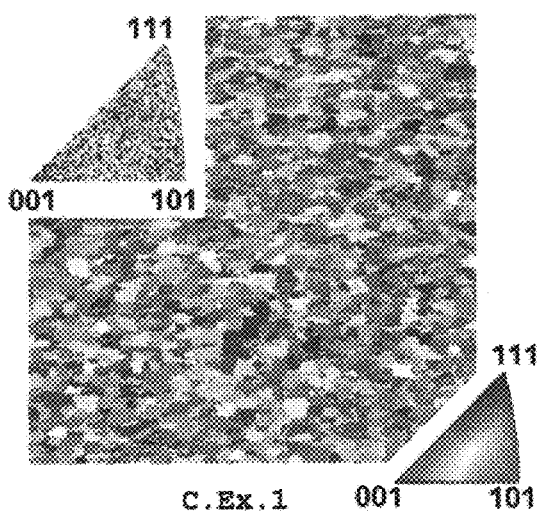
Figure 11:
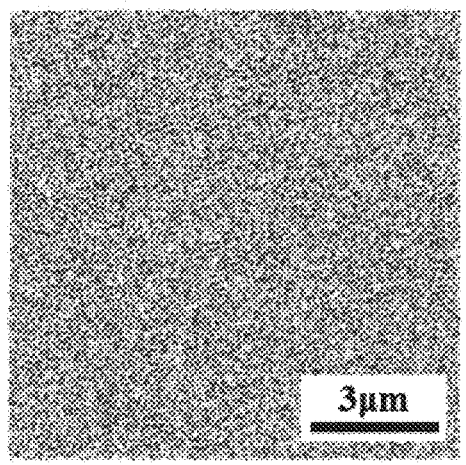

FIG. 8 illustrates the atomic force microscope images of the surfaces of the nickel catalytic layers in Example 1 and Comparative Examples 1 and 7, and FIG. 9 is a graph showing the results of analysis of the grain size of nickel using EBSD (Electron Back Scattering Diffraction). FIG. 10 is a graph showing the results of analysis of the nickel catalytic layers based on XRD, and FIG. 11 illustrates the crystal orientation of nickel using EBSD.

As shown in FIGS. 8 to 11, in Example 1, in which graphene was formed using the cover member, the grain size was large and thus the size of the grain boundary was reduced. Based on the results of analysis of XRD and the crystal orientation of surface nickel using EBSD, the size of the surface (111), which appears blue, was increased. Here, the increase in the size of the surface (111) is known to improve the properties of graphene.

INDUSTRIAL APPLICABILITY

Graphene produced using chemical vapor deposition according to the present invention can be uniformly formed under a variety of gas composition conditions, thus increasing production efficiency and reducing production costs. Also, as the grain size is increased and the number of grains on the surface of a metal catalyst is decreased, the size of the grain boundary is reduced, thus suppressing the growth of multilayer graphene, which readily forms at the grain boundary, thereby increasing the light transmittance and flexibility of graphene.

The invention claimed is:

1. A method of manufacturing graphene, comprising:
   (a) forming a metal catalytic layer on a substrate;
   (b) providing a cover member on the metal catalytic layer to form a covered area on a surface of the metal catalytic layer, wherein the covered area constitutes an area remaining covered by the cover member; and
   (c) growing a graphene layer in the covered area of the metal catalytic layer by performing chemical vapor deposition.

2. The method of claim 1, wherein the cover member is a substrate including at least one selected from the group consisting of an inorganic material, a metal, and a metal oxide.

3. The method of claim 2, wherein the cover member is an inorganic material, and the inorganic material is at least one selected from the group consisting of silicon, ceramic, and quartz.

4. The method of claim 2, wherein the cover member is a metal, and the metal is at least one selected from the group consisting of aluminum, tin, copper, iron, nickel, cobalt, and stainless steel.

5. The method of claim 1, wherein the substrate includes at least one selected from the group consisting of an inorganic material, a metal, and a metal oxide.

6. The method of claim 1, wherein the metal catalytic layer includes at least one selected from the group consisting of nickel, iron, copper, platinum, palladium, ruthenium, and cobalt.

7. The method of claim 1, wherein the chemical vapor deposition is performed using a mixture comprising hydrogen, argon, methane and ethane.

8. The method of claim 1, further comprising a step: (d) removing the cover member from the substrate and forming a polymer support layer on the graphene layer, after step (c).

9. The method of claim 8, further comprising a step: (e) removing the substrate and the metal catalytic layer from the graphene layer to obtain graphene having the polymer support layer formed thereon, after step (d).

10. The method of claim 1, further comprising a step: (d) removing the substrate, the metal catalytic layer and the cover member from the graphene layer, after step (c).

11. The method of claim 1, wherein the forming the metal catalytic layer is performed using any one process selected from the group consisting of sputtering, thermal evaporation, and e-beam evaporation.

12. The method of claim 1, wherein the metal catalytic layer is formed to a thickness of 10 to 1,000 nm on the substrate.

13. The method of claim 1, wherein the chemical vapor deposition is performed at a temperature of 400 to 1,300° C.

14. The method of claim 1, wherein the chemical vapor deposition is performed using any one process selected from the group consisting of low-pressure chemical vapor deposition, atmospheric pressure chemical vapor deposition, plasma-enhanced chemical vapor deposition, Joule-heating chemical vapor deposition, and microwave chemical vapor deposition.

* * * * *